United States Patent
Menge

(10) Patent No.: US 11,591,517 B2
(45) Date of Patent: Feb. 28, 2023

(54) LUMINESCENT MATERIAL INCLUDING A RARE EARTH HALIDE AND AN APPARATUS INCLUDING SUCH MATERIAL

(71) Applicant: SAINT-GOBAIN CERAMICS & PLASTICS, INC., Worcester, MA (US)

(72) Inventor: Peter R. Menge, Novelty, OH (US)

(73) Assignee: LUXIUM SOLUTIONS, LLC, Hiram, OH (US)

( * ) Notice: Subject to any disclaimer, the term of this patent is extended or adjusted under 35 U.S.C. 154(b) by 0 days.

(21) Appl. No.: 17/646,213

(22) Filed: Dec. 28, 2021

(65) Prior Publication Data

US 2022/0119703 A1     Apr. 21, 2022

Related U.S. Application Data

(63) Continuation of application No. 17/256,432, filed as application No. PCT/US2019/038508 on Jun. 21, 2019, now Pat. No. 11,242,484.

(Continued)

(51) Int. Cl.
*C09K 11/77* (2006.01)
*G01T 1/20* (2006.01)
(Continued)

(52) U.S. Cl.
CPC ............ *C09K 11/77* (2013.01); *G01T 1/202* (2013.01); *G01T 1/2018* (2013.01); *H01L 27/14663* (2013.01)

(58) Field of Classification Search
None
See application file for complete search history.

(56) References Cited

U.S. PATENT DOCUMENTS

| 7,608,828 B2 | 10/2009 | Koshikawa et al. |
| 9,599,727 B2 | 3/2017 | Ouspenski et al. |

(Continued)

FOREIGN PATENT DOCUMENTS

| CN | 103108941 A | 5/2013 |
| CN | 106753366 A | 5/2017 |

(Continued)

OTHER PUBLICATIONS

Tianshuai Lyu et al, "Bi 3+ acting both as an electron and as a hole trap in La−, Y−, and LuPO 4", Journal of Materials Chemistry C, GB, (Jan. 1, 2018), vol. 6, No. 23, doi:10.1039/C8TC01020J, ISSN 2050-7526, pp. 6240-6249, XP055666739.

(Continued)

*Primary Examiner* — Edwin C Gunberg
(74) *Attorney, Agent, or Firm* — Abel Schillinger, LLP

(57) ABSTRACT

A luminescent material can include a rare earth halide having a chemical formula of $RE_{(1-A-B-C)}HT_A DET_B SET_C X_Z$, wherein RE is a rare earth element, HT is an element or an interstitial site that provides a hole trap, DET is a dopant that provides a relatively deep electron trap, SET is a dopant that provides a relatively shallow electron trap, X is one or more halides, each of A, B, and C has a value greater at least 0.00001 and at most 0.09, and Z has a value in a range of 2 to 4. In an embodiment, a ratio of B:C is selected so that luminescent material has good linearity performance. In another embodiment, the ratio of B:C can be in a range of 10:1 to 100:1.

20 Claims, 2 Drawing Sheets

Related U.S. Application Data

(60) Provisional application No. 62/691,646, filed on Jun. 29, 2018.

(51) Int. Cl.
*G01T 1/202* (2006.01)
*H01L 27/146* (2006.01)

(56) References Cited

U.S. PATENT DOCUMENTS

| | | |
|---|---|---|
| 9,796,922 B2 | 10/2017 | Menge et al. |
| 2004/0108492 A1 | 6/2004 | Dorenzo et al. |
| 2007/0210256 A1 | 9/2007 | Dorenbos et al. |
| 2008/0067391 A1 | 3/2008 | Shimizu et al. |
| 2012/0267999 A1 | 10/2012 | Sakuta et al. |
| 2013/0327986 A1 | 12/2013 | Blahuta et al. |
| 2014/0117242 A1 | 5/2014 | Dorenbos et al. |
| 2018/0010041 A1 | 1/2018 | Menge et al. |
| 2021/0269713 A1 | 9/2021 | Menge |

FOREIGN PATENT DOCUMENTS

| | | |
|---|---|---|
| CN | 107400510 A | 11/2017 |
| EP | 2718398 A2 | 4/2014 |
| WO | 2012170390 A1 | 12/2012 |
| WO | 2020005761 A1 | 1/2020 |

OTHER PUBLICATIONS

Supplemental Extended European Search Report dated Feb. 22, 2022 for EP 19 82 7319, 3 pgs.

Supplemental Extended European Search Report dated Feb. 2, 2022 for EP 19 82 5115, 3 pgs.

International Search Report and Written Opinion for PCT/US2019/038508, dated Oct. 14, 2019, 12 pages.

International Search Report and Written Opinion for PCT/US2019/038504, dated Oct. 15, 2019, 10 pages.

Aberg, D. et al., "Origin of resolution enhancement by co-doping of scintillators: Insight from electronic structure calculations," Applied Physics Letters, 2014, vol. 104, pp. 211908-1-211908-4.

Alekhin, M. S., et al., "Improvement of LaBr3:5%Ce Scintillation Properties by Li+, Na+, Mg2+, Ca2+, Sr2+, and Ba2+ Go-Doping," Journal of Applied Physics, vol. 113, 2013, pp. 224904-1-224904-7.

Donnald, S.B., "A Study of Energy Resolution and Nonproportionality of YAlO3:Ce and Gd3Ga3Al2O12:Ce ," PhD diss., University of Tennessee, 2014, 147 pages.

Kamada, K., et al., "Co-doping effects on luminescence and scintillation properties of Ce doped Lu3Al5O12 scintillator,"Nuclear Instruments & Methods in Physics Research A: Accelerators, Spectrometers, Detectors and Associated Equipment, 2015, vol. 782, pp. 9-12.

Kitaura, M., et al., "Probing shallow electron traps in cerium-doped Gd3Al2Ga3O12 scintillators by UV-induced absorption spectroscop," Applied Physics Express, 2016, vol. 9, No. 7, abstract only.

Kucera, M., "Temperature dependence of Ce3+ emission kinetics in Mg2+ co-doped GAGG:Ce epitaxial garnet films," SCINT 2017—14th Int. Conference of Scintillating Materials and their Applications, 1 page.

Lecoq, P., "Development of new scintillators for medical applications," Nuclear Instruments & Methods in Physics Research A, 2016, vol. 809, pp. 130-139.

Li, C., "Action of co-dopant in electron-trapping materials: The case of Sm3+Sm3+ in Mn2+Mn2+-activated zinc borosilicate glasses," Applied Physics Letters, 2004, vol. 85, Issue 12, abstract only.

Nikl, M., et al., "Defect Engineering in Ce-Doped Aluminum Garnet Single Crystal Scintillators," Crystal Growth & Design, 2014, vol. 14, Issue 9, pp. 4827-4833, abstract only.

Nikl, M., et al., "Recent R&D Trends in Inorganic Single-Crystal Scintillator Materials for Radiation Detection," Advanced Optical Materials, 2015, abstract only.

Prusa, P., et al.,"Garnet Scintillators of Superior Timing Characteristics: Material, Engineering by Liquid Phase Epitaxy," Advanced Optical Materials, 2017, abstract only.

Rothfuss, H.E., et al., "The Effect of Ca2+ Codoping on Shallow Traps in YSO:Ce Scintillators," IEEE Transactions an Nuclear Science, 2009, vol. 56, Issue 3, pp. 958-961, abstract only.

Quarati, F.G.A., et al., "Co-doping of CeBr3 scintillator detectors for energy resolution enhancement,"Nuclear Instruments & Methods in Physics Research A, 2014, vol. 735, pp. 655-658, abstract only.

Wang, Z., et al., "Theoretical method to select appropriate codopants as efficient foreign electron traps for Lu3Al2Ga3O12:Tb3+/Ln3+ persistent phosphor," Optical Society of America, 2016, vol. 6, No. 4, 12 pages.

LUMINESCENT MATERIAL INCLUDING A RARE EARTH HALIDE AND AN APPARATUS INCLUDING SUCH MATERIAL

CROSS-REFERENCE TO RELATED APPLICATION(S)

This application is a continuation of and claims priority under 35 U.S.C. § 120 to U.S. patent application Ser. No. 17/256,432, filed on Dec. 28, 2020, entitled "LUMINESCENT MATERIAL INCLUDING A RARE EARTH HALIDE AND AN APPARATUS INCLUDING SUCH MATERIAL," and naming Peter R. MENGE as the inventor, which is a national stage application, filed under 35 U.S.C. § 371, of International Patent Application No. PCT/US2019/038508, filed on Jun. 21, 2019, entitled "LUMINESCENT MATERIAL INCLUDING A RARE EARTH HALIDE AND AN APPARATUS INCLUDING SUCH MATERIAL," and naming Peter R. MENGE as the inventor, which claims priority under 35 U.S.C. § 119(e) to U.S. Provisional Patent Application No. 62/691,646, filed on Jun. 29, 2018, entitled "LUMINESCENT MATERIAL INCLUDING A RARE EARTH HALIDE AND AN APPARATUS INCLUDING SUCH MATERIAL," and naming Peter R. MENGE as the inventor, all of which applications are assigned to the current assignee hereof and incorporated by reference herein in their entireties.

TECHNICAL FIELD

The present disclosure is directed to luminescent materials and apparatuses using the same, and more particularly to luminescent materials including rare earth halides and apparatuses including such luminescent materials.

BACKGROUND ART

A luminescent material including a rare earth halide can be co-doped to improve performance such as increased light output, lower energy resolution, less departure from perfect proportionality, or the like. In many instance the co-doping includes a scintillating activator and one other dopant. Such co-doping may not optimize performance of the luminescent material. Further improvements with luminescent materials are desired.

BRIEF DESCRIPTION OF THE DRAWINGS

Embodiments are illustrated by way of example and are not limited in the accompanying figures.

Figure 1:
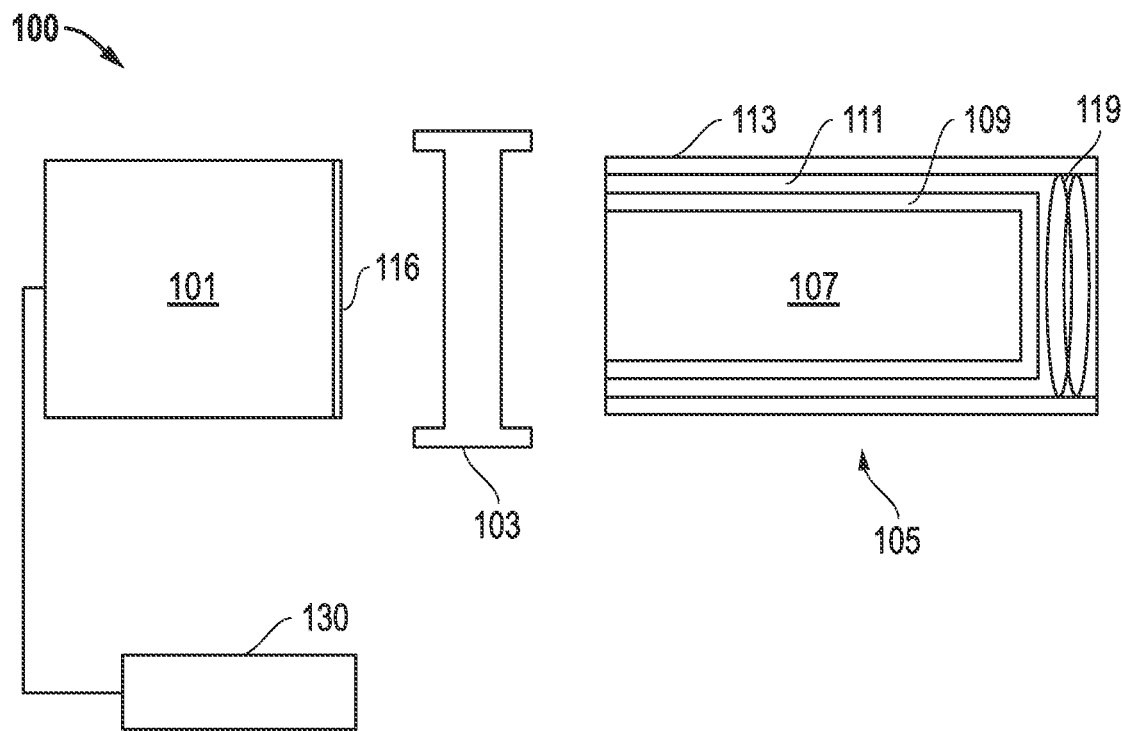
FIG. 1 includes an illustration of a radiation detection apparatus in accordance with an embodiment that can be used in medical imaging.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE PREFERRED EMBODIMENT(S)

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "avalanche photodiode" refers to a single photodiode having a light-receiving area of least 1 $mm^2$ and is operated in a proportional mode.

The term "SiPM" is intended to mean a photomultiplier that includes a plurality of photodiodes, wherein each of the photodiodes have a cell size less than 1 $mm^2$, and the photodiodes are operated in Geiger mode. The semiconductor material for the diodes in the SiPM can include silicon, a compound semiconductor, or another semiconductor material.

The term "principal constituent," when referring to a particular element within a compound, is intended to that the element is present as part of the molecular formula for the compound, as opposed to a dopant. A dopant within a compound is typically present at a concentration no greater than 5% atomic. As an example, Ce-doped $LaBr_3$ ($LaBr_3$:Ce) includes La and Br are principal constituents of the base compound, $LaBr_3$, and Ce is a dopant and not a principal constituent when Ce is 2% atomic of the cation content of the compound.

The term "rare earth" or "rare earth element" is intended to mean Y, La, and the Lanthanides (Ce to Lu) in the Periodic Table of the Elements. In chemical formulas, a rare earth element will be represented by "RE."

The term "rare earth halide" is intended to mean a compound having a general chemical formula of $REX_z$, wherein RE is one or more rare earth elements, and X is one or more halides, and Z is a value of 2 to 4. The rare earth halides may include one or more dopants. Rare earth halides do not include other rare earth-containing compounds, such as elpasolites, other Group 1-rare earth halides, Group 2-rare earth halides, Group 13-rare earth halides, or the like.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the arts of luminescent materials and apparatuses including luminescent materials.

A luminescent material can include a rare earth halide having a chemical formula of $RE_{(1-A-B-C)}HT_ADET_BSET_CX_z$, wherein RE is a rare earth element, HT is an element or an interstitial site that provides a hole trap, DET is a dopant that provides a relatively deep electron trap, SET is a dopant that provides a relatively shallow electron trap, X is one or more halides, each of A, B, and C has a value greater at least 0.0001 and at most 0.09, and Z has a value in a range of 2 to 4. In an embodiment, a ratio of B:C is selected so that luminescent material has good linearity performance. In another embodiment, the ratio of B:C can be in a range of 10:1 to 100:1.

The luminescent material can have better linearity as compared another luminescent material that has a hole trap and only one electron trap. Linearity refers to how well a luminescent material approaches perfect linear proportionality between gamma ray energy and light output. The linearity can be measured as a departure from perfect linearity. A luminescent material having perfect linearity would always create the same number of photons per unit energy absorbed, regardless of the energy of the gamma ray. Thus, its departure from perfect linearity is zero.

The departure from perfect linearity is more significant at lower energies than it is for higher energies. A higher energy gamma ray (for example, greater than 2000 keV) may enter the luminescent material, which in turn, may generate several lower energy gamma rays (for example, less than 50 keV). If the luminescent material generates less scintillating light for lower energy gamma rays, the luminescent material has poor linearity. Thus, the response of the luminescent material to gamma rays at lower energies, such as less than 50 keV, can be more significant to linearity than the response at higher gamma ray energies.

Departure from perfect linearity can be determined as follows. Data for responses to different gamma ray energies are collected over a range of gamma ray energies. For example, the range of gamma ray energies can be from 5 keV to 20 keV. After reading this specification, skilled artisans will be able to select an energy range for their particular application.

After the data is collected, using a least squares fit, a linear equation is generated having an equation of:

$$E_{calc} = m * PH \quad \text{Equation 1}$$

where:
$E_{calc}$ is the calculated energy;
PH is the pulse height (light output); and
m is the slope of the line (fit coefficient).

Note that the line passes through the point (0,0) corresponding to a pulse height of zero (no light output) when the energy is zero. Thus, there is no y-axis offset when the line corresponds to perfect linearity. For a particular gamma ray energy, the departure from perfect linearity ("DFPL") is determined by the following equation.

$$DFPL = ((E_{calc} - E_{actual})/E_{actual}) * 100\% \quad \text{Equation 2}$$

where $E_{actual}$ is the actual gamma ray energy corresponding to light output and Ecalc is calculated using Equation 1.

For a set of DFPL data points, an average value, a largest positive deviation, a largest negative deviation, a maximum deviation, an absolute value of any of the foregoing, or any combination thereof can be obtained. In a particular embodiment, the average DFPL can be determined using an integral in accordance with Equation 3 below.

$$DFPL_{average} = \frac{\int_{E_{lower}}^{E_{upper}} DFPL(E_i) \cdot dE_i}{E_{upper} - E_{lower}} \quad \text{Equation 3}$$

where
$DFPL(Ei)$ is DFPL at energy $E_i$;
$E_{upper}$ is the upper limit of the energy range; and
$E_{lower}$ is the lower limit of the energy range.

In the luminescent material, an element or an interstitial site can be a hole trap within the luminescent material. The element may be an element that is a principal constituent of a base compound that makes up the luminescent material or may be a dopant.

Different dopants can provide electron traps. As compared to a relatively shallower electron trap, more energy is required for a relatively deeper electron trap to release an electron and for such electron to reach the minimum energy level of the conduction band of the base compound (without dopants) of the luminescent material. As used herein, the bandgap energy and conduction band are for the undoped base compound by itself, as opposed to such compound when in contact with a dissimilar material (due to potential band bending).

A ratio of the dopants can be selected in an amount such that performance is improved as compared to only of the dopants being present. In an embodiment, one of the dopants may provide a relatively shallower electron trap as compared to the other dopant. As used herein, the depth of an electron trap is determined by the difference in energy between the minimum energy of the conduction band of the undoped base compound of the luminescent material and the ionization energy of the dopant within such luminescent material. A relatively shallower electron trap may have an energy difference of at most 0.3 eV, and a relatively deeper electron trap may have an energy difference of greater than 0.3 eV. As used herein, the dopant that provides the relatively deeper electron trap is referred to as "DET", and the dopant that provides the relatively shallower electron trap is referred to as "SET". On a relative basis, the energy level difference between a minimum energy level of a conduction band of the base compound and an ionization energy of the SET is at most 10% of the bandgap energy, and the energy level difference between a minimum energy level of a conduction band of the base compound and an ionization energy of the DET is greater than 10% of the bandgap energy.

In a luminescent material, the DET may cause a negative departure from perfect linearity, and the SET may cause a positive departure from perfect linearity. A proper combination of dopants corresponding to the DET and SET can help to reduce the departure from perfect linearity over a desired energy range as compared to having only a DET or only a SET, or if the DET and SET are present in an improper amount.

The ratio of the concentrations of the dopants for the electron traps may be selected, so that the number of electrons having sufficient energy to reach the conduction band of the base compound from each of the DET and SET are similar. In an embodiment, the concentration of the DET is greater than the concentration of the SET, as the relatively deeper electron traps relinquish electrons less readily than the relatively shallower electron traps. In an embodiment, the ratio of the DET to the SET is in a range of 10:1 to 100:1 on an atomic basis.

For a particular DET, the ratio of the concentrations of the DET:SET increases as the energy level difference between the minimum energy level of the conduction band and the ionization energy of the DET increases. For example, one DET may have an energy level difference of 0.7 eV, and another DET may have an energy level difference of 1.1 eV. The ratio of the relatively DET:SET will be lower for the DET with the energy level difference of 0.7 eV and will be higher for the other DET with the energy level difference of 1.1 eV.

In an embodiment, the ratio of the DET:SET is at least 15:1, at least 20:1, or at least 30:1, and in another embodiment, the ratio of the DET:SET is at most 95:1, at most 80:1, or at most 70:1. In a particular embodiment, the ratio of the DET:SET is in a range of 15:1 to 95:1, 20:1 to 80:1, or 30:1 to 70:1.

In general, Group 1, Group 2, rare earth elements, and Bi may be any one or more of a hole trap, a DET, or a SET. The particular function of the foregoing elements may depend on the composition of the base compound, the activator, and another dopant present. Targeted radiation can be absorbed by the luminescent material, and in response, an electron can be ejected from the activator. Thus, an activator can provide hole traps during the scintillation process. In an embodiment, the activator can be Ce, Pr, Sm, or Tb. However, in another embodiment, Ce, Pr, Sm, or Tb may not be an activator and may be a DET or a SET. In another embodiment, Eu or Yt may be an activator and used as a hole trap. In still another embodiment, Eu or Yt may be a DET or a SET. In a further embodiment, Bi may be present as a hole trap, a DET, or a SET. Ca or Sr may be a SET, and many of the Group 1 elements (for example, Na), Mg, Ba, and rare earth elements, when not hole traps, can be a DET.

Thus, depending the principal constituents within a base compound of a luminescent material and dopants selected, a particular element can provide hole traps in one luminescent material, can be a DET in another luminescent material, or may be a SET when the base compound or another dopant is changed. After reading this specification, skilled artisans will be able to determine the hole traps for the luminescent material, select a DET and a SET, and set a DET:SET ratio for the luminescent material to achieve the needs or desires for a particular application.

In an embodiment, the luminescent material can be a rare earth halide that includes dopants that are hole and electron traps. In an embodiment, the luminescent material can be represented by the following chemical formula:

$RE_{(1-A-B-C)}HT_ADET_BSET_CX_z$, wherein

RE is a rare earth element,
HT is an element that provides a hole trap,
DET is a dopant that provides a relatively deep electron trap,
SET is a dopant that provides a relatively shallow electron trap,
X is one or more halides,
each of A, B, and C has a value greater at least 0.00001 and at most 0.09, and
Z has a value in a range of 2 to 4.

In an embodiment, each of A, B, and C has a value of at least 0.0002, at least 0.0005, or at least 0.001, and in another embodiment, each of A, B, and C has a value of at most 0.05, at most 0.04, or at most 0.03.

RE and HT may be the same element or may be different elements. For example, in a particular embodiment, RE can be La, and HT can be Ce, and in another embodiment, both RE and HT can be Ce. In an embodiment, X is a single halide, and in another embodiment, X can be a mixture of different halides. While Z can have a value of 2 to 4, Z can be in a range of 2.8 to 3.2.

The ratio of B:C can be selected to provide desired performance. For example, the ratio of B:C may be selected to reduce an average departure from perfect linear for a particular energy range. Such particular energy range may be 5 keV to 20 keV. In an embodiment, a ratio of B:C is at least 15:1, at least 20:1, or at least 30:1, and in another embodiment, the ratio of the B:C is at most 95:1, at most 80:1, or at most 70:1. In a particular embodiment, the ratio of the B:C is in a range of 15:1 to 95:1, 20:1 to 80:1, or 30:1 to 70:1. A different energy range may have a different ratio. For example, when the lowest energy within the energy range is at least 300 keV, the luminescent material may not be as sensitive to the ratio of B:C, and thus the ratio may be outside the previously described values.

Exemplary base compounds that can be modified in accordance with the above-referenced formulas include $CeCl_3$, $CeBr_3$, $CeCl_{(3Y)}Br_{(3-3Y)}$, $CeBr_{(3-3Y)}I_{3Y}$, $LaCl_3$, $LaBr_3$, $LaCl_{(3Y)}Br_{(3-3Y)}$, $LaBr_{(3-3Y)}I_{3Y}$, $LuCl_3$, $LuBr_3$, $LuCl_{(3Y)}Br_{(3-3Y)}$, $Lu\ Br_{(3-3Y)}I_{3Y}$, or the like, wherein $0<Y<1$. For the foregoing exemplary base compounds, the HT can be Ce, Pr, Sm, or Tb, the DET can be a Group 1 or a Group 2 element other than Ca and Sr, and the SET can be Ca or Sr. Other combinations of elements may be used for HT, DET, and SET. The previously listing is illustrative and is not meant to limit the scope of the present invention.

The luminescent material can be in the form of a single crystal material. The luminescent material in the form of a single crystal may be formed using a fusion zone technique, a Czochralski, a Bridgman, or an edge feed growth (EFG) technique. With the fusion zone technique, a solid material can be processed such that a crystal seed is in contact with one end of the solid, and a heat source causes a local region (portion of the solid) to become molten near the crystal. As the heat source moves away from the crystal, the molten portion becomes monocrystalline, and a new local region farther from the seed crystal becomes molten. The process is continued until the rest of the solid has become crystallized. The solid can be oriented in a vertical or horizontal direction during the process. The particular crystal growth methods as melting zone and floating zone are belonging to general notation known as fusion zone technique. The fusion zone technique may be able to incorporate a higher level of dopant than the Czochralski or Bridgman growth techniques, as volatilization or segregation of species may limit the ability of how much dopant will be in the crystal.

The luminescent material can be in the form of a polycrystalline material. Such materials can be formed using calcining, pressing, sintering, or any combination thereof. In an embodiment, a polycrystalline powder (obtained by hydrothermal method or by precipitation in alkaline solution or by vapor phase), the powder possibly being compacted with or without the use of a binder or thermally densified or assembled by a sol-gel method. In a further embodiment, the luminescent material can be a monocrystalline or polycrystalline fiber (obtained by micro-pulling down or by EFG), or thin film (obtained by CVD), or a polycrystalline glass-ceramic. The luminescent material may be incorporated in a host material that may be transparent, such as a glass or a plastic or a liquid or a crystal. The host material may be used to excite indirectly the scintillating compound.

Any of the luminescent materials as previously described can be used in a variety of applications. Exemplary applications include gamma ray spectroscopy, isotope identification, Single Positron Emission Computer Tomography (SPECT) or Positron Emission Tomography (PET) scanner, x-ray imaging, oil well-logging detectors, and detecting the presence of radioactivity, a laser device, or an optical data storage device. The luminescent materials can be used for other applications, and thus, the list is merely exemplary and not limiting. A couple of specific applications are described below.

FIG. 1 illustrates an embodiment of a radiation detection apparatus 100 that can be used for gamma ray analysis, such as a Single Positron Emission Computer Tomography (SPECT) or Positron Emission Tomography (PET) analysis. In the embodiment illustrated, the radiation detection apparatus 100 includes a photosensor 101, an optical interface 103, and a scintillation device 105. Although the photosensor 101, the optical interface 103, and the scintillation device 105 are illustrated separate from each other, skilled artisans will appreciate that photosensor 101 and the scintillation device 105 can be coupled to the optical interface 103, with the optical interface 103 disposed between the photosensor 101 and the scintillation device 105. The scintillation device 105 and the photosensor 101 can be optically coupled to the optical interface 103 with other known coupling methods, such as the use of an optical gel or bonding agent, or directly through molecular adhesion of optically coupled elements.

The photosensor 101 may be a photomultiplier tube (PMT), a semiconductor-based photomultiplier, or a hybrid photosensor. A semiconductor-based photomultiplier can include an avalanche photodiode or a SiPM. The photosensor 101 can receive photons emitted by the scintillation device 105, via an input window 116, and produce electrical pulses based on numbers of photons that it receives. The photosensor 101 is electrically coupled to an electronics module 130. The electrical pulses can be shaped, digitized, analyzed, or any combination thereof by the electronics module 130 to provide a count of the photons received at the photosensor 101 or other information. The electronics module 130 can include an amplifier, a pre-amplifier, a discriminator, an analog-to-digital signal converter, a photon counter, a pulse shape analyzer or discriminator, another electronic component, or any combination thereof. The photosensor 101 can be housed within a tube or housing made of a material capable of protecting the photosensor 101, the electronics module 130, or a combination thereof, such as a metal, metal alloy, other material, or any combination thereof.

The scintillation device 105 includes a scintillator 107 that can include any one of the luminescent materials previously described. The scintillator 107 is substantially surrounded by a reflector 109. In one embodiment, the reflector 109 can include polytetrafluoroethylene (PTFE), another material adapted to reflect light emitted by the scintillator 107, or a combination thereof. In an illustrative embodiment, the reflector 109 can be substantially surrounded by a shock absorbing member 111. The scintillator 107, the reflector 109, and the shock absorbing member 111 can be housed within a casing 113.

The scintillation device 105 includes at least one stabilization mechanism adapted to reduce relative movement between the scintillator 107 and other elements of the radiation detection apparatus 100, such as the optical interface 103, the casing 113, the shock absorbing member 111, the reflector 109, or any combination thereof. The stabilization mechanism may include a spring 119, an elastomer, another suitable stabilization mechanism, or a combination thereof. The stabilization mechanism can be adapted to apply lateral forces, horizontal forces, or a combination thereof, to the scintillator 107 to stabilize its position relative to one or more other elements of the radiation detection apparatus 100.

As illustrated, the optical interface 103 is adapted to be coupled between the photosensor 101 and the scintillation device 105. The optical interface 103 is also adapted to facilitate optical coupling between the photosensor 101 and the scintillation device 105. The optical interface 103 can include a polymer, such as a silicone rubber, that is polarized to align the reflective indices of the scintillator 107 and the input window 116. In other embodiments, the optical interface 103 can include gels or colloids that include polymers and additional elements.

Figure 2:
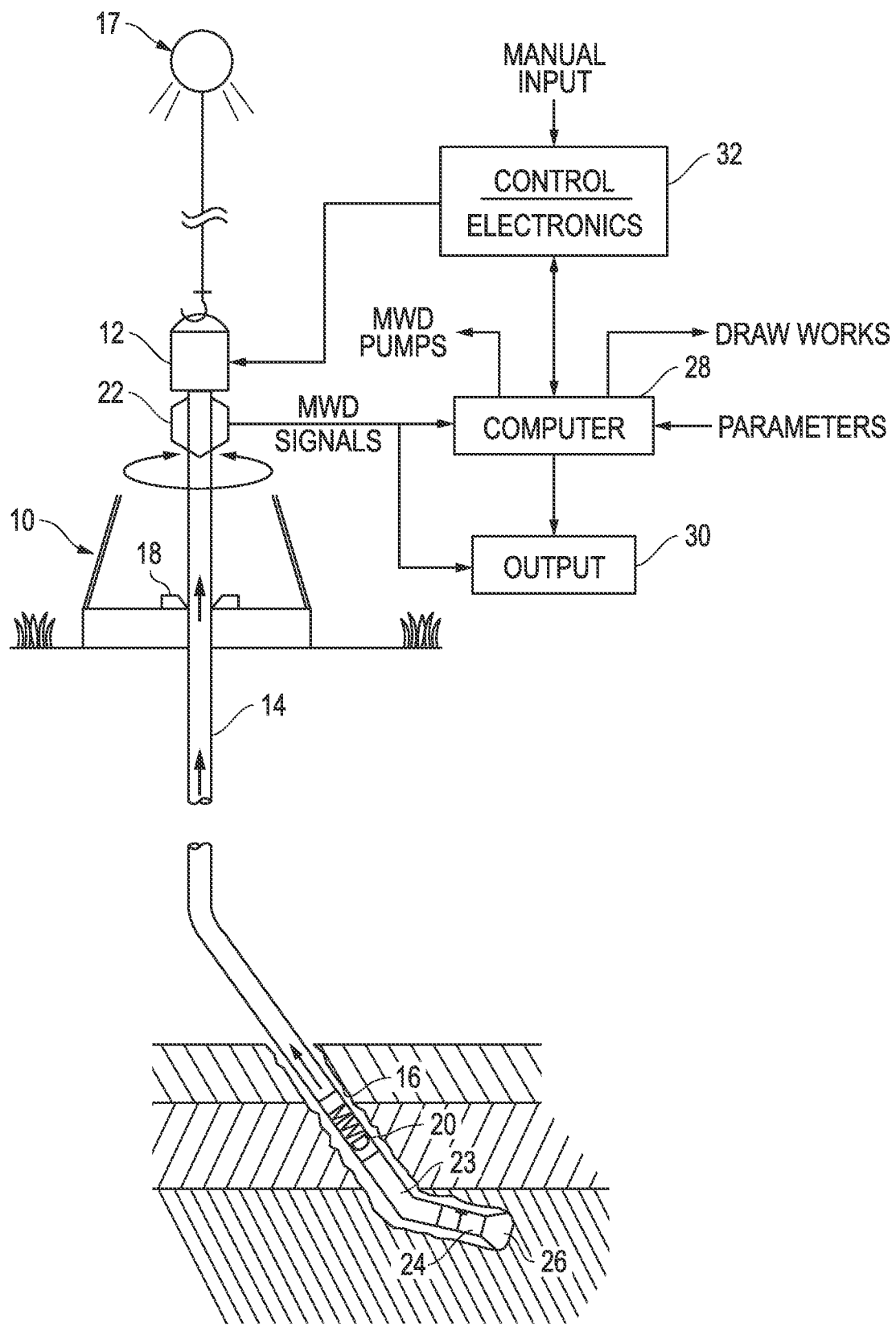

The luminescent material can be used in a well logging application. FIG. 2 includes a depiction of a drilling apparatus 10 includes a top drive 12 connected to an upper end of a drill string 14 that is suspended within a well bore 16 by a draw works 17. A rotary table, including pipe slips, 18 can be used to maintain proper drill string orientation in connection with or in place of the top drive 12. A downhole telemetry measurement and transmission device 20, commonly referred to as a measurement-while-drilling (MWD) device, is part of a downhole tool that is connected to a lower end of the drill string 14. The MWD device transmits drilling-associated parameters to the surface by mud pulse or electromagnetic transmission. These signals are received at the surface by a data receiving device 22. The downhole tool includes a bent section 23, a downhole motor 24, and a drill bit 26. The bent section 23 is adjacent the MWD device for assistance in drilling an inclined well bore. The downhole motor 24, such as a positive-displacement-motor (PDM) or downhole turbine, powers the drill bit 26 and is at the distal end of the downhole tool.

The downhole signals received by the data reception device 22 are provided to a computer 28, an output device 30, or both. The computer 28 can be located at the well site or remotely linked to the well site. An analyzer device can be part of the computer 28 or may be located within the downhole tool near the MWD device 20. The computer 28 and analyzer device can include a processor that can receive input from a user. The signals are also sent to an output device 30, which can be a display device, a hard copy log printing device, a gauge, a visual audial alarm, or any combination thereof. The computer 28 is operatively connected to controls of the draw works 17 and to control electronics 32 associated with the top drive 12 and the rotary table 18 to control the rotation of the drill string and drill bit. The computer 28 may also be coupled to a control mechanism associated with the drilling apparatus's mud pumps to control the rotation of the drill bit. The control electronics 32 can also receive manual input, such as a drill operator.

Figure 3:
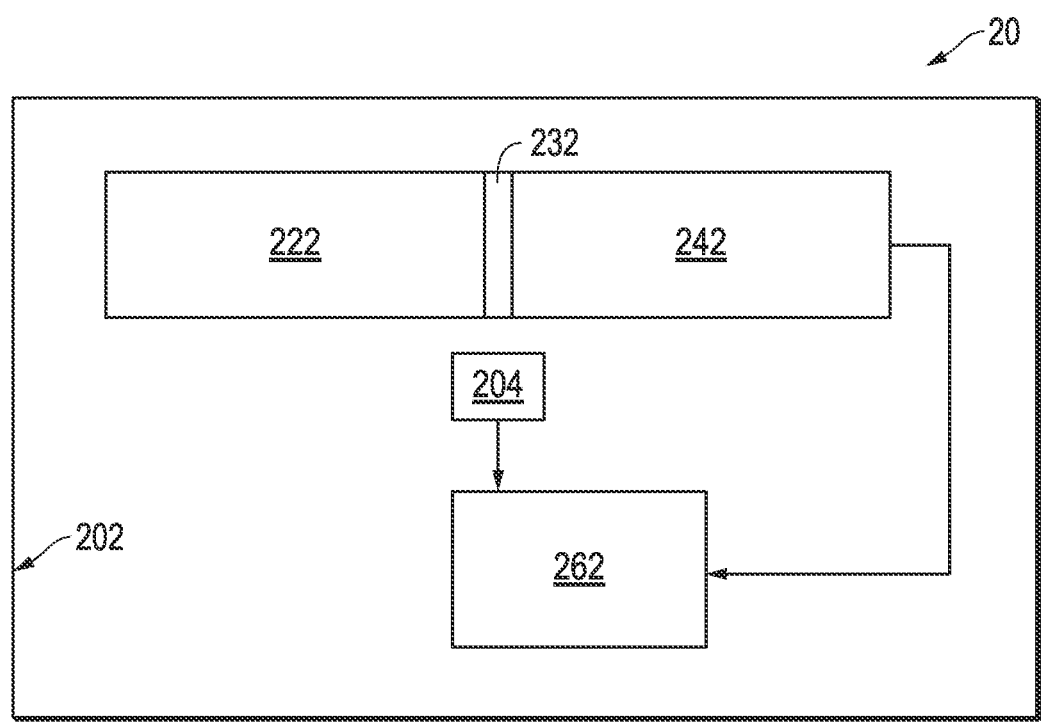
FIGS. 2 and 3 include illustrations of a radiation detection apparatus in accordance with an embodiment that can be used in drilling or well logging.

FIG. 3 illustrates a depiction of a portion of the MWD device 20 within the downhole tool 16. The MWD device 20 includes a housing 202, a temperature sensor 204, a scintillator 222, an optical interface 232, a photosensor 242, and an analyzer device 262. The housing 202 can include a material capable of protecting the scintillator 222, the photosensor 242, the analyzer device 262, or a combination thereof, such as a metal, metal alloy, other material, or any combination thereof. The scintillator 222 can include one or more of the luminescent materials previously described. The temperature sensor 204 is located adjacent to the scintillator 222, the photosensor 242, or both. The temperature sensor 204 can include a thermocouple, a thermistor, or another suitable device that is capable of determining the temperature within the housing over the normal operating temperature of the MWD device 20. A radiation detection apparatus includes the scintillation crystal 222 that is optically coupled to the photosensor 242 that is coupled to the analyzer device 262.

Luminescent materials as described in accordance with the concepts described herein have an unusually low average departure from perfect linearity, particularly for energies less than 50 keV, such as in a range of 5 keV to 20 keV. The luminescent material can include a rare earth halide, a HT, a DET, and a SET. A ratio of the concentrations of the DET:SET can be tailored to achieve the good linearity performance over a desired energy range.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. A luminescent material including a rare earth halide having a chemical formula of: $RE_{(1-A-B-C)}HT_A DET_B SET_C X_z$, wherein: RE is a rare earth element, HT is an element or an interstitial site that provides a hole trap, DET is a dopant that provides a relatively deep electron trap, SET is a dopant that provides a relatively shallow electron trap, X is one or more halides, each of A, B, and C has a value greater at least 0.00001 and at most 0.09, Z has a value in a range of 2 to 4, and a ratio of B:C is selected so that luminescent material has an average value for a departure from perfect linearity in a range of 5 keV to 20 keV that is less as compared to a different luminescent material that is doped with only the HT and the DET or only the HT and the SET.

Embodiment 2. The luminescent material of Embodiment 1, wherein a ratio of B:C is in a range of 10:1 to 100:1.

Embodiment 3. The luminescent material of Embodiment 1 or 2, wherein the average value for the departure from perfect linearity ($DFPL_{average}$) is determined by:

$$DFPL_{average} = \frac{\int_{E_{lower}}^{E_{upper}} DFPL(E_i) \cdot dE_i}{E_{upper} - E_{lower}},$$

where
 $DFPL(Ei)$ is DFPL at energy $E_i$;
 $E_{upper}$ is 20 keV; and
 $E_{lower}$ is 5 keV.

Embodiment 4. A luminescent material comprising: $RE_{(1-A-B-C)}HT_A DET_B SET_C X_z$, wherein: RE is a rare earth element, HT is an element that provides a hole trap, DET is a dopant that provides a relatively deep electron trap, SET is a dopant that provides a relatively shallow electron trap, X is one or more halides, each of A, B, and C has a value greater at least 0.00001 and at most 0.09, Z has a value in a range of 2 to 4, and a ratio of B:C is in a range of 10:1 to 100:1.

Embodiment 5. The luminescent material of any one of Embodiments 2 to 4, wherein the ratio of B:C is at least 3:1, at least 15:1, at least 20:1, or at least 30:1.

Embodiment 6. The luminescent material of any one of Embodiments 2 to 5, wherein the ratio of B:C is at most 100:1, at most 95:1, at most 80:1, or at most 70:1.

Embodiment 7. The luminescent material of any one of Embodiments 2 to 4, wherein the ratio of B:C is in a range of 3:1 to 100:1, 15:1 to 95:1, 20:1 to 80:1, or 30:1 to 70:1.

Embodiment 8. The luminescent material of any one of Embodiments 2 to 4, wherein Z has a value in a range of 2.8 to 3.2.

Embodiment 9. The luminescent material of any one of Embodiments 1 to 7, wherein the luminescent material includes a base compound, wherein the base compound, without any dopant, has a minimum energy level of a conduction band that is closer to an ionization energy of the SET than to an ionization energy of the DET.

Embodiment 10. The luminescent material of any one of Embodiments 1 to 7, wherein the luminescent material includes a base compound, wherein the base compound, without any dopant, has a bandgap energy, wherein an energy level difference between a minimum energy level of a conduction band of the base compound without any dopant and an ionization energy of the SET is at most 10% of the bandgap energy.

Embodiment 11. The luminescent material of any one of Embodiments 1 to 9, wherein the luminescent material includes a base compound, wherein the undoped base compound, without any dopant, has a bandgap energy, wherein an energy level difference between a minimum energy level of a conduction band of the base compound without any dopant and an ionization energy of the DET is greater than 10% of the bandgap energy.

Embodiment 12. The luminescent material of any one of Embodiments 1 to 7, wherein the luminescent material includes a base compound, wherein an energy level difference between a minimum energy level of a conduction band of the base compound without any dopant and an ionization energy of the SET is at most 0.3 eV.

Embodiment 13. The luminescent material of any one of Embodiments 1 to 7 and 12, wherein the luminescent material includes a base compound, wherein an energy level difference between a minimum energy level of a conduction band of the base compound without any dopant and an ionization energy of the DET is greater than 0.3 eV.

Embodiment 14. The luminescent material of any one of Embodiments 1 to 13, wherein the HT, the DET, or the SET is a rare earth element or Bi.

Embodiment 15. The luminescent material of any one of Embodiments 1 to 14, wherein the HT, the DET, or the SET is Ce, Pr, Sm, or Tb.

Embodiment 16. The luminescent material of Embodiment 15, wherein the DET includes a Group 1 element, Mg, or Ba, and the SET includes Ca or Sr.

Embodiment 17. The luminescent material of any one of Embodiments 1 to 14, wherein the HT, the DET, or the SET is Eu or Yt.

Embodiment 18. A radiation detection apparatus comprising: a scintillator including the luminescent material of any one of Embodiments 1 to 16; and a photosensor configured to receive scintillating light from the luminescent material.

Embodiment 19. The radiation detection apparatus of Embodiment 18, wherein the radiation detection apparatus comprises a medical imaging apparatus, a well logging apparatus, or a security inspection apparatus.

Embodiment 20. A positron emission tomography scanner comprising the luminescent material of any one of Embodiments 1 to 16.

Embodiment 21. A laser device comprising the luminescent material of any one of Embodiments 1 to 17.

Embodiment 22. An optical data storage device comprising the luminescent material of any one of Embodiments 1 to 16.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and apparatuses that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A luminescent material including a rare earth halide having a chemical formula of:

$$RE_{(1-A-B-C)}HT_A DET_B SET_C X_z,$$

wherein:
RE is a rare earth element,
HT is an element or an interstitial site that provides a hole trap, wherein HT is selected from the group consisting of Ce, Pr, Sm, and Tb;
DET is a dopant that provides a relatively deep electron trap, wherein DET is selected from the group consisting of Group 1 elements and Group 2 elements other than Ca and Sr,
SET is a dopant that provides a relatively shallow electron trap, wherein SET is selected from the group consisting of Ca and Sr,
X is one or more halides,
each of A, B, and C has a value greater at least 0.00001 and at most 0.09,
Z has a value in a range of 2 to 4, and
a ratio of B:C is between 10:1 and 100:1 on an atomic basis.

2. The luminescent material of claim 1, wherein the average value for the departure from perfect linearity (DFPL$_{average}$) is determined by:

$$DFPL_{average} = \frac{\int_{E_{lower}}^{E_{upper}} DFPL(E_i) \cdot dE_i}{E_{upper} - E_{lower}},$$

where
DFPL(Ei) is DFPL at energy $E_i$;
$E_{upper}$ is 20 keV; and
$E_{lower}$ is 5 keV.

3. The luminescent material of claim 1, wherein the ratio of B:C is in a range of 15:1 to 95:1.

4. The luminescent material of claim 1, wherein the ratio of B:C is in a range of 30:1 to 70:1.

5. The luminescent material of claim 3, wherein Z has a value in a range of 2.8 to 3.2.

6. The luminescent material of claim 3, wherein the luminescent material includes a base compound, wherein the base compound, without any dopant, has a minimum energy level of a conduction band that is closer to an ionization energy of the SET than to an ionization energy of the DET.

7. The luminescent material of claim 3, wherein the luminescent material includes a base compound, wherein the base compound, without any dopant, has a bandgap energy, wherein an energy level difference between a minimum energy level of a conduction band of the base compound without any dopant and an ionization energy of the SET is at most 10% of the bandgap energy.

8. The luminescent material of claim 3, wherein the luminescent material includes a base compound, wherein the undoped base compound, without any dopant, has a bandgap energy, wherein an energy level difference between a minimum energy level of a conduction band of the base compound without any dopant and an ionization energy of the DET is greater than 10% of the bandgap energy.

9. The luminescent material of claim 3, wherein the luminescent material includes a base compound, wherein an energy level difference between a minimum energy level of a conduction band of the base compound without any dopant and an ionization energy of the SET is at most 0.3 eV.

10. The luminescent material of claim 9, wherein the luminescent material includes a base compound, wherein an energy level difference between a minimum energy level of a conduction band of the base compound without any dopant and an ionization energy of the DET is greater than 0.3 eV.

11. A radiation detection apparatus comprising:
a scintillator having a formula $RE_{(1-A-B-C)}HT_A DET_B SET_C X_z$,
wherein:
RE is a rare earth element or Bi,
HT is an element or an interstitial site that provides a hole trap, wherein HT is selected from the group consisting of Ce, Pr, Sm, and Tb;
DET is a dopant that provides a relatively deep electron trap, wherein DET is selected from the group consisting of Group 1 elements and Group 2 elements other than Ca and Sr,
SET is a dopant that provides a relatively shallow electron trap, wherein SET is selected from the group consisting of Ca and Sr,
X is one or more halides,
each of A, B, and C has a value greater at least 0.00001 and at most 0.09,
Z has a value in a range of 2 to 4, and
a ratio of B:C is between 10:1 and 100:1 on an atomic basis; and
a photosensor configured to receive scintillating light from the luminescent material.

12. The radiation detection apparatus of claim 11, wherein an energy level difference between a minimum energy level of a conduction band of the base compound without any dopant and an ionization energy of SET is at most 0.3 eV.

13. The radiation detection apparatus of claim 11, wherein an energy level difference between a minimum energy level of a conduction band of the base compound without any dopant and an ionization energy of DET is greater than 0.3 eV.

14. The radiation detection apparatus of claim 11, wherein the DET includes a Group 1 element, Mg, or Ba.

15. The radiation detection apparatus of claim 11, wherein the HT, the DET, or the SET is Eu or Yt.

16. The radiation detection apparatus of claim 11, wherein the ratio of B:C is in a range of 15:1 to 95:1.

17. The radiation detection apparatus of claim 11, wherein the ratio of B:C is in a range of 20:1 to 80:1.

18. The radiation detection apparatus of claim 11, wherein the ratio of B:C is in a range of 30:1 to 70:1.

19. The radiation detection apparatus of claim 11, wherein the luminescent material includes a base compound, wherein the base compound, without any dopant, has a bandgap energy, wherein an energy level difference between a minimum energy level of a conduction band of the base compound without any dopant and an ionization energy of the SET is at most 10% of the bandgap energy.

20. The radiation detection apparatus of claim 11, wherein the luminescent material includes a base compound, wherein the undoped base compound, without any dopant, has a bandgap energy, wherein an energy level difference between a minimum energy level of a conduction band of the base compound without any dopant and an ionization energy of the DET is greater than 10% of the bandgap energy.

* * * * *